(12) United States Patent
Brey et al.

(10) Patent No.: US 10,180,665 B2
(45) Date of Patent: Jan. 15, 2019

(54) FLUID-COOLED COMPUTER SYSTEM WITH PROACTIVE COOLING CONTROL USING POWER CONSUMPTION TREND ANALYSIS

(75) Inventors: Thomas M. Brey, Cary, NC (US);
Vinod Kamath, Raleigh, NC (US);
Jason A. Matteson, Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 1295 days.

(21) Appl. No.: 13/234,563

(22) Filed: Sep. 16, 2011

(65) Prior Publication Data
US 2013/0073096 A1 Mar. 21, 2013

(51) Int. Cl.
*G05D 23/19* (2006.01)
*G05B 13/02* (2006.01)
(Continued)

(52) U.S. Cl.
CPC ......... *G05B 13/02* (2013.01); *G05D 23/1917* (2013.01); *G06F 1/206* (2013.01);
(Continued)

(58) Field of Classification Search
CPC ... G05D 23/19; G05D 7/0617; H05K 7/20836
(Continued)

(56) References Cited

U.S. PATENT DOCUMENTS 6,182,232 B1   1/2001 Klein
6,643,128 B2   11/2003 Chu et al.
(Continued)

FOREIGN PATENT DOCUMENTS

EP    2098942 A1    9/2009
WO    WO2009128839 A1    10/2009
WO    WO2010050080 A1    5/2010

OTHER PUBLICATIONS

Jerry Steele, "Current-Shunt Monitor Modulates Fan Speed", Electronic Design, Current-Shunt Monitor Modulates Fan Speed, Sep. 15, 2003, 1 page.

(Continued)

*Primary Examiner* — Darrin D Dunn
(74) *Attorney, Agent, or Firm* — Jeffrey L. Streets

(57) ABSTRACT

A fluid-cooled computer system includes a plurality of heat-generating components and a cooling system configured for supplying a cooling fluid at a controlled cooling fluid flow rate to cool the heat-generating components. A temperature-based cooling control circuit includes a temperature sensor configured for sensing a temperature of the heat-generating components and control logic for increasing a cooling fluid flow rate in response to the temperature exceeding a temperature threshold. A power-based cooling control circuit is configured for identifying and quantifying an increasing power consumption trend over a target time interval and, during a period that the temperature of the electronic device does not exceed the temperature threshold, increasing a cooling fluid flow rate to the electronic device in response to the magnitude of the increasing power consumption trend exceeding a power threshold. In one option, the fluid-cooled computer system is a server and the heat-generating components include a processor.

18 Claims, 5 Drawing Sheets

(51) Int. Cl.
*H05K 7/20* (2006.01)
*G06F 1/20* (2006.01)

(52) U.S. Cl.
CPC ... *H05K 7/20836* (2013.01); *G06F 2200/201* (2013.01); *Y02D 10/16* (2018.01)

(58) Field of Classification Search
USPC ........................................................ 700/282
See application file for complete search history.

(56) References Cited

U.S. PATENT DOCUMENTS

| | | | | |
|---|---|---|---|---|
| 6,826,456 | B1* | 11/2004 | Irving | G06F 1/20 361/695 |
| 7,421,623 | B2* | 9/2008 | Haugh | G06F 1/206 702/130 |
| 7,502,952 | B2 | 3/2009 | Chotoku et al. | |
| 7,583,043 | B2 | 9/2009 | Chung et al. | |
| 2003/0067745 | A1* | 4/2003 | Patel | H05K 7/20745 361/690 |
| 2004/0065097 | A1* | 4/2004 | Bash | H05K 7/20836 62/180 |
| 2007/0067656 | A1* | 3/2007 | Ranganathan | G06F 1/3203 713/320 |
| 2007/0213881 | A1* | 9/2007 | Belady | G05D 23/19 700/300 |
| 2008/0222435 | A1* | 9/2008 | Bolan | G06F 1/3203 713/310 |
| 2008/0276111 | A1* | 11/2008 | Jacoby | G06F 21/55 713/340 |
| 2009/0167228 | A1 | 7/2009 | Chung et al. | |
| 2009/0187783 | A1 | 7/2009 | Hansen | |
| 2009/0235097 | A1* | 9/2009 | Hamilton | G06F 1/3203 713/320 |
| 2010/0010678 | A1* | 1/2010 | Dawson | G05D 23/1917 700/276 |
| 2010/0049995 | A1 | 2/2010 | Casey et al. | |
| 2010/0076607 | A1* | 3/2010 | Ahmed et al. | 700/276 |
| 2011/0055605 | A1* | 3/2011 | Jackson | G06F 1/3203 713/320 |
| 2011/0060470 | A1* | 3/2011 | Campbell | G05D 23/1934 700/282 |
| 2011/0106326 | A1* | 5/2011 | Anunobi et al. | 700/291 |
| 2011/0197612 | A1* | 8/2011 | Campbell et al. | 62/259.2 |
| 2011/0320834 | A1* | 12/2011 | Ingels | G06F 1/266 713/310 |
| 2012/0215373 | A1* | 8/2012 | Koblenz | G05D 23/1919 700/300 |
| 2012/0283898 | A1* | 11/2012 | Shen | G05D 23/1932 701/22 |
| 2013/0035795 | A1* | 2/2013 | Pfeiffer | G05B 15/02 700/276 |
| 2013/0076381 | A1* | 3/2013 | Takayanagi | G01K 3/005 324/750.03 |

OTHER PUBLICATIONS

Jerry Steele, "Keep Cool by Sensing Current to Control Fans", http://www.electronics-cooling.com/2004/08/keep-cool-by-sensing-current-to-control-fans/, Aug. 1, 2004, 4 pages.

Maxim, "PMBus 5-Channel Power-Supply Manager and Intelligent Fan Controller", max34441, 19-5488; Rev 0; 8/10, 2010, pp. 1-53.

* cited by examiner

FLUID-COOLED COMPUTER SYSTEM WITH PROACTIVE COOLING CONTROL USING POWER CONSUMPTION TREND ANALYSIS

BACKGROUND

Field of the Invention

The present invention relates generally to power management and cooling in computer equipment.

Background of the Related Art

A data center is a facility where computer equipment and related infrastructure are consolidated for centralized operation and management. Computer equipment may be interconnected in a datacenter to produce large, powerful computer systems that are capable of meeting the computing requirements of entities that store and process large amounts of data, such as corporations, web hosting services, and Internet search engines. A data center may house any number of racks, with each rack capable of holding numerous modules of computer equipment. The computer equipment typically includes a large number of rack-mounted servers along with supporting equipment, such as switches, power supplies, network communications interfaces, environmental controls, and security devices. These devices are typically mounted in racks in a compact, high-density configuration to make efficient use of space while providing physical access and enabling the circulation of cool air.

Two important aspects of operating a datacenter are the management of power consumed by the equipment and the provision of adequate cooling. The large amount of rack-mounted computer equipment in a datacenter may collectively consume a large quantity of power and generate a large amount of heat. The infrastructure provided in a datacenter is intended to support these significant power and cooling demands. For example, the datacenter may provide electrical utilities with the capacity to power a large volume of rack-mounted computer equipment, and a cooling system capable of removing the large quantity of heat generated by the rack-mounted computer equipment. The cooling system in many installations will also include a particular arrangement of equipment racks into alternating hot aisles and cold aisles, and a computer room air conditioner ("CRAC") capable of supplying chilled air to the cold aisles. Meanwhile, chassis-mounted blower modules help remove heat from the racks and exhaust the heated air into the hot aisles.

The servers commonly used in datacenters are becoming more challenging to cool, as a result of parameters such as higher component packaging densities, sharper variations in server workload, and a general demand to reduce energy consumption within cooling subsystems. Power management in a server or among a group of servers addresses the balance between providing greater amounts of cooling and driving up energy consumption. Providing more cooling than necessary will consume more energy than necessary. Conversely, too little cooling can cause a temperature threshold to be exceeded and invoke performance-reducing power reduction measures. Exceeding such a temperature threshold may cause the server to perform at a lower performance level in order to reduce the heat generated and avoid component damage or data integrity issues. In order to avoid exceeding such a temperature threshold even when a component suddenly goes from an idle state to maximum workload, systems typically keep critical components well below the allowable temperature thresholds to provide an additional safety margin. Of course, maintaining components at lower operating temperatures requires the consumption of additional power.

BRIEF SUMMARY

An example of a fluid-cooled computer system includes a plurality of heat-generating components and a cooling system configured for supplying a cooling fluid at a controlled cooling fluid flow rate to cool the heat-generating components. The fluid-cooled computer system may be, for example, a server, wherein the plurality of heat-generating components includes a processor. A temperature-based cooling control circuit includes a temperature sensor configured for sensing a temperature of the heat-generating components and control logic for increasing a cooling fluid flow rate in response to the temperature exceeding a temperature threshold. A power-based cooling control circuit is configured for identifying and quantifying an increasing power consumption trend over a target time interval and, during a period that the temperature of the electronic device does not exceed the temperature threshold, increasing a cooling fluid flow rate to the electronic device in response to the magnitude of the increasing power consumption trend exceeding a power threshold.

DETAILED DESCRIPTION

Figure 1:
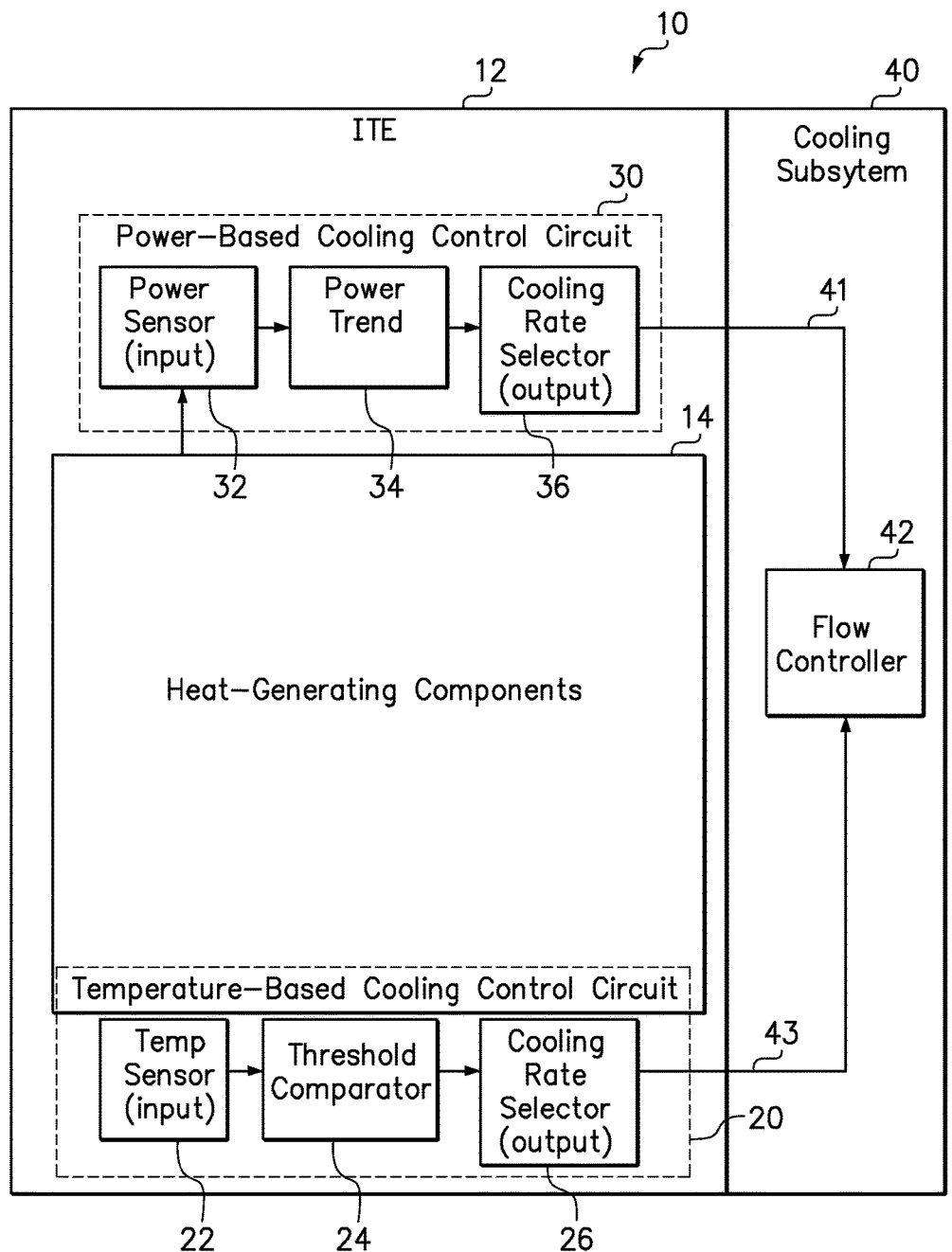
FIG. 1 is a schematic diagram of an electronic system having a cooling system that combines the use of temperature and power feedback in cooling a unit of Information Technology Equipment (ITE).

The present invention includes systems and methods for proactively increasing a cooling fluid flow rate directed to a heat-generating component in response to an increasing power consumption trend of the heat-generating component. In an example system, a power-based cooling control circuit and a temperature-based cooling control circuit share control of a cooling subsystem to control the cooling fluid flow rate. The power-based cooling control circuit monitors the real-time, instantaneous power consumption of one or more of its heat-generating components, identifies and quantifies an increasing power consumption trend over a moving target time interval of a finite but non-zero duration, and selectively adjusts the cooling fluid flow rate in response to the computed power consumption trend exceeding a power threshold. In one embodiment, the target time interval may have a fixed length within the range of between 5 and 30 seconds. The target time interval is of sufficient length to minimize the influence of power spikes of shorter duration.

As an option, power spikes of less than a predefined duration may even be ignored, so as to have no effect on the cooling fluid flow rate.

By quantifying the power consumption trend, the magnitude of the power consumption trend provides an indicator or prediction of imminent heating. One or more predefined power thresholds may be set to determine an appropriate cooling system response commensurate with an amount of heating that may result from the increasing power consumption trend. By making the cooling system responsive to the increasing power consumption trend, a cooling response is initiated before temperatures have risen appreciably as a result of the increasing power trend. The cooling response may therefore be more mild than waiting for a component temperature to reach a temperature threshold. Since fan power consumption can be an exponential function of fan speed, reducing the maximum fan speed can significantly reduce cooling costs. The shared control of the power-based cooling control circuit and temperature-based cooling control circuit further reduces the likelihood of a critical temperature threshold from occurring. The proactive cooling may also allow a warning temperature threshold to be safely increased, thus decreasing a margin between the critical temperature threshold and the lower, warning temperature threshold.

A system and method are disclosed for proactively cooling an electronic system in response to a dynamically computed power consumption trend over a moving time interval. In an example method, a temperature of an electronic device is monitored. A cooling fluid flow rate to the electronic device is increased in response to the temperature exceeding a temperature threshold. A power consumption of the electronic device is also monitored. An increasing power consumption trend over a target time interval is identified and quantified. During a period that the temperature of the electronic device does not exceed the temperature threshold, a cooling fluid flow rate to the electronic device is increased in response to the magnitude of the increasing power consumption trend exceeding a power threshold.

FIG. 1 is a schematic diagram of an electronic system 10 having a cooling subsystem 40 that combines the use of temperature and power control feedback to cool a unit of Information Technology Equipment (ITE) 12. The ITE 12 may be embodied, for example, as a computer hardware device, such as a rack-mounted server. The ITE 12 includes one or more heat-generating components 14 that consume electrical power and generate heat in relation to the power consumed. The cooling subsystem 40 cools the ITE 12 by directing a cooling fluid, such as air or a liquid coolant, to the ITE 12 at a controlled cooling fluid flow rate. For example, the cooling subsystem 40 may circulate air as the cooling fluid, using one or more fans to cool the ITE 12. The fans may include an on-board cooling fan provided on the ITE 12 or an external device such as a chassis-mounted blower module to drive airflow through a plurality of ITE units. Alternatively, the cooling subsystem 40 may circulate a chilled liquid coolant as the cooling fluid through a heat exchanger in direct mechanical and thermal contact with the heat-generating components 14. An example application combining the use of air and liquid coolant is a rear-door air-to-liquid heat exchanger on a rack of computer equipment, wherein airflow passing through the rack removes heat by convection and the heated air is cooled by the rear-door heat exchanger.

Whether using air, liquid coolant, or both as the cooling fluid, the rate of cooling is related to the cooling fluid flow rate. For example, cooling increases as a result of increasing an airflow rate through the ITE 12 or increasing a liquid flow rate within a liquid-cooled heat exchanger. The cooling subsystem 40 includes a flow controller 42 for enforcing a selected cooling fluid flow rate. For example, if the cooling fluid is air, the flow controller 42 may control the flow rate of the air through the ITE 12 by controlling a fan speed. Alternatively, if the cooling fluid is a liquid coolant, such as water, in a closed-system heat exchanger, the flow controller 42 may control the flow rate of the liquid coolant using a variable pump. However, the cooling subsystem 40 has a finite limit on the rate at which it is capable of flowing cooling fluid. In the case of a fan, the maximum flow rate and corresponding maximum cooling will occur when the fan(s) are operating at their maximum fan speed. In the case of a liquid coolant heat exchanger, the maximum flow rate and corresponding maximum cooling will occur when the liquid coolant is circulated at the maximum rate provided by the cooling subsystem 40, which may be determined by the operational limits of a liquid pump. The cost of operating the cooling subsystem 40 generally increases with increasing flow rate. For example, the power consumed by a fan and the associated monetary cost of operating the fan is generally a cubic function of the fan speed, such that energy costs associated with cooling the ITE 12 may increase exponentially with fan speed.

The system 10 of FIG. 1 includes two subsystems for selecting the flow rate to be enforced by the flow controller 42 of the cooling subsystem 40. The two subsystems are embodied here as a temperature-based cooling control circuit 20 and a power-based cooling control circuit 30, which are independently in communication with the flow controller 42 of the cooling subsystem 40. As explained in further detail below, the temperature-based cooling control circuit 20 and the power-based cooling control circuit 30 share control of the cooling fluid flow rate by each selectively adjusting the flow rate to be enforced by the flow controller 42. The temperature-based cooling control circuit 20 responds to the temperature exceeding one or more predefined temperature thresholds, such as a warning temperature threshold and a higher, critical temperature threshold. The power-based cooling control circuit 30, however, responds proactively to an increasing power consumption trend before the temperature has a chance to reach a higher temperature threshold in response to the power consumption trend. By responding proactively to increased power consumption, it is possible to prevent or delay the temperature from exceeding the next higher temperature threshold. Cooling costs may also be reduced by reducing the maximum flow rate required to cool the heat-generating components 14 over a given timeframe. For example, increasing the fan speed in response to an increasing power consumption trend, before a next higher temperature threshold is reached, can reduce the maximum fan speed at which the fan is operated in a given timeframe, as compared with waiting until a temperature threshold has been reached to increase the fan speed.

The temperature-based cooling control circuit 20 includes a temperature sensor 22, a threshold comparator circuit 24, and a temperature-based cooling rate selector 26. The temperature sensor 22 may be in direct thermal contact with one of the heat-generating components. The temperature sensor 22 may be positioned to sense the temperature of one of the heat-generating component 14 expected to reach the highest operating temperatures. For example, a processor typically runs hotter than other components in a computer system, in which case a built-in temperature sensing diode or other integrated temperature sensor included on the processor may be used as the temperature sensor 22. The threshold comparator 24 and temperature-based cooling rate selector 26 may each comprise control logic for performing their functions. The threshold comparator 24 is in communication with the temperature sensor 22 for comparing the sensed temperature with one or more predefined temperature thresholds. The temperature-based cooling rate selector 26 may then request a cooling rate on the basis of that comparison.

The temperature-based cooling rate selector 26 outputs a signal 43 requesting a cooling rate (or adjustment to the cooling rate) to the cooling subsystem 40 to be enforced by the flow controller 42. The signal 43 may reflect an amplitude of the output from the temperature-based cooling control circuit 20. The requested cooling rate may be specified quantitatively, such as by a volumetric flow rate of liquid coolant or a selected fan speed. The requested cooling rate may alternatively be specified as one of a plurality of different predefined levels. For example, a fan included with the cooling subsystem 40 may be operable at discrete fan speed levels, and the requested cooling rate may specify a specific fan speed level. The requested cooling rate may alternatively be a specified adjustment, such as by specifying "more" or "less" cooling, in response to which the flow controller 42 may increase or decrease the fluid flow rate by one or more predefined steps.

In one implementation, a single temperature threshold is provided, so that the temperature-based cooling control circuit 20 will only cause the cooling rate to increase if and when the temperature reaches that single temperature threshold. The single temperature threshold may be selected as an upper temperature limit, such as a critical temperature threshold, and the response from the cooling subsystem 40 may be to maximize the cooling fluid flow rate if and when the sensed temperature reaches the upper temperature limit. If the maximum cooling fluid flow rate is insufficient to cool the ITE 12, then the ITE may be configured to automatically enter a reduced power mode, or even shut down if necessary to avoid unsafe operating temperatures.

In another implementation, a plurality of different thresholds is provided, and the cooling fluid flow rate is increased in response to each successive threshold that is reached. For example, the flow controller 42 may be configured to operate at a first level in response to exceeding a first temperature threshold, a second, higher level in response to exceeding a second temperature threshold greater than the first level, and so forth. Regardless of whether one or multiple temperature thresholds are provided, the cooling fluid flow rate is increased only after the ITE 12 has reached a threshold value, which is after the power consumption has previously increased to cause the temperature of the ITE 12 to reach that temperature threshold value.

Whether the embodiments use a single temperature threshold, a plurality of temperature thresholds, or continuous adjustments of fans speed as a function of temperature, the power-based cooling control circuit may produce an output to the fan speed in response to detecting an increasing power consumption trend. During a sudden increase in power consumption, the power-based cooling control circuit may produce a substantial output to a fan speed controller. Still, if the power consumption reaches a new steady state value (i.e., the increasing power consumption trend stops or nears zero), then the power-based cooling control circuit will contribute little or no signal to the fan speed controller and the fan speed will be substantially determined by the output of the temperature-based cooling control circuit.

The power-based cooling control circuit 30 also communicates with the flow controller 42 for selectively adjusting the flow rate. However, the power-based cooling control circuit 30 proactively increases the requested flow rate in response to power consumption, before a temperature threshold is reached. By identifying and quantifying an increasing power trend over a target time interval, the power-based cooling control circuit 30 is able to anticipate the need for more cooling and to increase airflow accordingly. The power-based cooling control circuit 30 may proactively increase cooling by increasing the cooling fluid flow rate before exceeding a temperature threshold, to avoid or at least delay exceeding the temperature threshold as compared with no increase in cooling. If the temperature-based cooling control circuit 20 is responsive to a plurality of different temperature thresholds, the power-based cooling control circuit 30 may proactively increase cooling when the temperature is between two successive temperature thresholds, so as to delay exceeding each successive temperature threshold and possibly to prevent the temperature from exceeding a next temperature threshold.

In the ITE 12 of FIG. 1, the illustrated components of the power-based cooling control circuit 30 are a power sensor 32, a power consumption trend analyzer 34, and a power-based cooling rate selector (output) 36. The power sensor 32 may be a physical sensor in electrical communication with one or more of the heat-generating components 14. As illustrated in FIG. 1, the power sensor 32 may sense a net power consumption of the entire group of heat-generating components 14 on the ITE 12. The power sensor 32 may be provided in-line with a power supply to a motherboard, for example. Alternatively, the power sensor 32 may be provided to sense the power consumption of a specific one of the heat-generating components 14, such as a processor on a system board, where predominantly all of the heat generated by the ITE 12 is related to the power consumption of that component. The power sensor 32 may sense current flow as an indication of power, since power consumption is directly related to current flow. The power sensor 32 outputs the sensed power consumption, which is a dynamic and constantly varying parameter, to the power consumption trend analyzer 34.

The power-based cooling control circuit 30 does not increase the requested flow rate directly in response to an instantaneous increase in power consumption detected by the power sensor 32. Rather, the power consumption trend analyzer 34 is provided to analyze the power consumption over a time interval to identify and quantify a power consumption trend over that time interval. In one embodiment, the time interval may be between about 5 and 30 seconds. This is a moving time interval that may be frequently or continuously updated. For example, every second or every tenth of a second, the power consumption trend analyzer 34 may compute an updated power consumption trend for the time interval leading up to that instant. Further discussion of the power consumption trend analysis is provided below with reference to FIGS. 3 and 4.

On the basis of the power consumption trend, the P-based cooling rate selector 36 outputs a signal 41 requesting a cooling rate to be enforced by the flow controller 42. The signal 41 may be representative of the magnitude of the power consumption trend. The flow controller 42 may receive and enforce the cooling rate requests from the power-based cooling control circuit 30 in the same way that the flow controller 42 receives and processes the cooling rate requests from the temperature-based cooling control circuit 20. The requested cooling rate may be specified quantitatively, as one of a plurality of different predefined levels or comparatively as by specifying "more" or "less" cooling.

Arbitration logic (not shown) may be included in case of any conflict between a cooling rate requested by the temperature-based cooling control circuit 20 and a cooling rate requested by the power-based cooling control circuit 30. For example, if the temperature-based cooling control circuit 20 and power-based cooling control circuit 30 request two different cooling rates, the flow controller 42 may handle the conflicting request by deferring to the higher of the two requested cooling rates, or by giving requests from one of the two circuits 20, 30 priority over requests from the other of the two circuits 20, 30. Alternatively, the flow controller 42 may simply process and enforce requested cooling rate selectors in the order in which they are received, without any arbitration, and without deference to whether the requested cooling rates come from the temperature-based cooling control circuit 20 or the power-based cooling control circuit 30. For example, as power consumption increases over time, the power-based cooling control circuit 30 may request a cooling rate increase before the temperature reaches a first temperature threshold.

If the temperature eventually reaches the first temperature threshold, the temperature-based cooling control circuit 20 may then request a cooling rate increase to slow down the rate at which the ITE 12 heats up. In one embodiment, the cooling rate may be solely determined by the power-based cooling control circuit 30, unless and until a temperature threshold is reached. In another embodiment, the cooling rate may be solely determined by the temperature-based cooling control circuit 20, unless and until a power threshold is reached to which the power-based cooling control circuit 30 is responsive. If the temperature threshold is reached, such as a maximum or critical temperature, the temperature-based cooling control circuit 20 may override any previously selected fluid flow rate. The temperature-based cooling control circuit 20 in that case may take over control of the cooling subsystem 40 in order to ensure unsafe operating levels are not exceeded.

Figure 2:
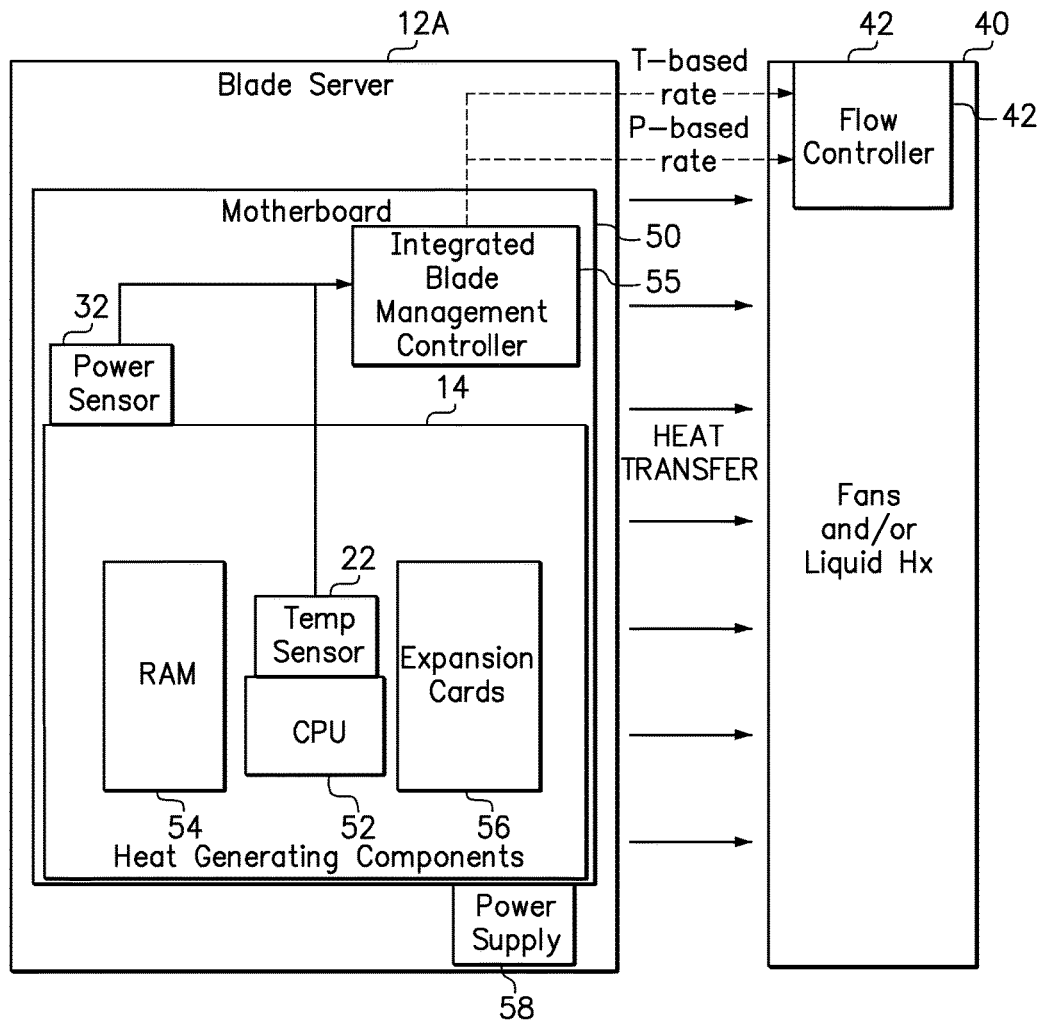
FIG. 2 is a schematic diagram of a specific example embodiment wherein the ITE of FIG. 1 is a blade server.

FIG. 2 is a schematic diagram of a more specific example embodiment of the electronic system 10, wherein the ITE 12 is a blade server 12A. The heat-generating components 14 in this example are components of a motherboard 50. These heat-generating components 14 include a central processing unit (CPU) 52, system memory in the form of random access memory (RAM) 54, and one or more expansion cards 56. Among these components, the CPU 52 is typically going to operate at hotter temperatures than the other components. Thus, the temperature sensor 22 is located directly on the CPU 52. The power sensor 32 may be physically located anywhere within the blade server 12A, and may sense the power consumption of the entire motherboard 50. Alternatively, the power sensor 32 may be configured to sense the power consumption of the CPU 52 only, since the CPU 52 may consume more power than the other components also by a significant margin. A power supply 58 may include circuitry to convert alternating current (AC) from an AC source (not shown) to direct current (DC) at a plurality of different DC voltages for supplying the various components of the motherboard 50 according to their different power requirements.

An integrated management controller 55 is provided on the motherboard 50. The management controller 55 may be a Baseboard Management Controller (BMC) or an Integrated Management Module (IMM), for example. The management controller 55 manages various aspects of the server's operation at the server level, and may communicate with a chassis management module in a chassis having a plurality of the blade servers 12A. While the temperature sensor 22 and power sensor 32 are separate from the management controller 55, other elements of both the temperature-based cooling control circuit 20 and power-based cooling control circuit 30 of FIG. 1 may be included on the management controller 55. For example, control logic for implementing the threshold comparator 24 and temperature-based cooling rate selector 26 and control logic for implementing the power consumption trend analyzer 34 and the P-based cooling rate selector 36 (See FIG. 1) may all reside "on-chip" in this embodiment of the electronic system 10. Thus, the signal outputs of the temperature sensor 22 and power sensor 32 are fed to the management controller 55. The management controller 55 may combine the use of the threshold comparator 24, temperature-based cooling rate selector 26, power consumption trend analyzer 34, and P-based cooling rate selector 36 from FIG. 1 to selectively output either a requested T-dependent flow rate or P-based flow rate to the flow controller 42. The manner in which the requested T-dependent flow rate or P-based flow rate is as described above with reference to FIG. 1.

Figure 3:
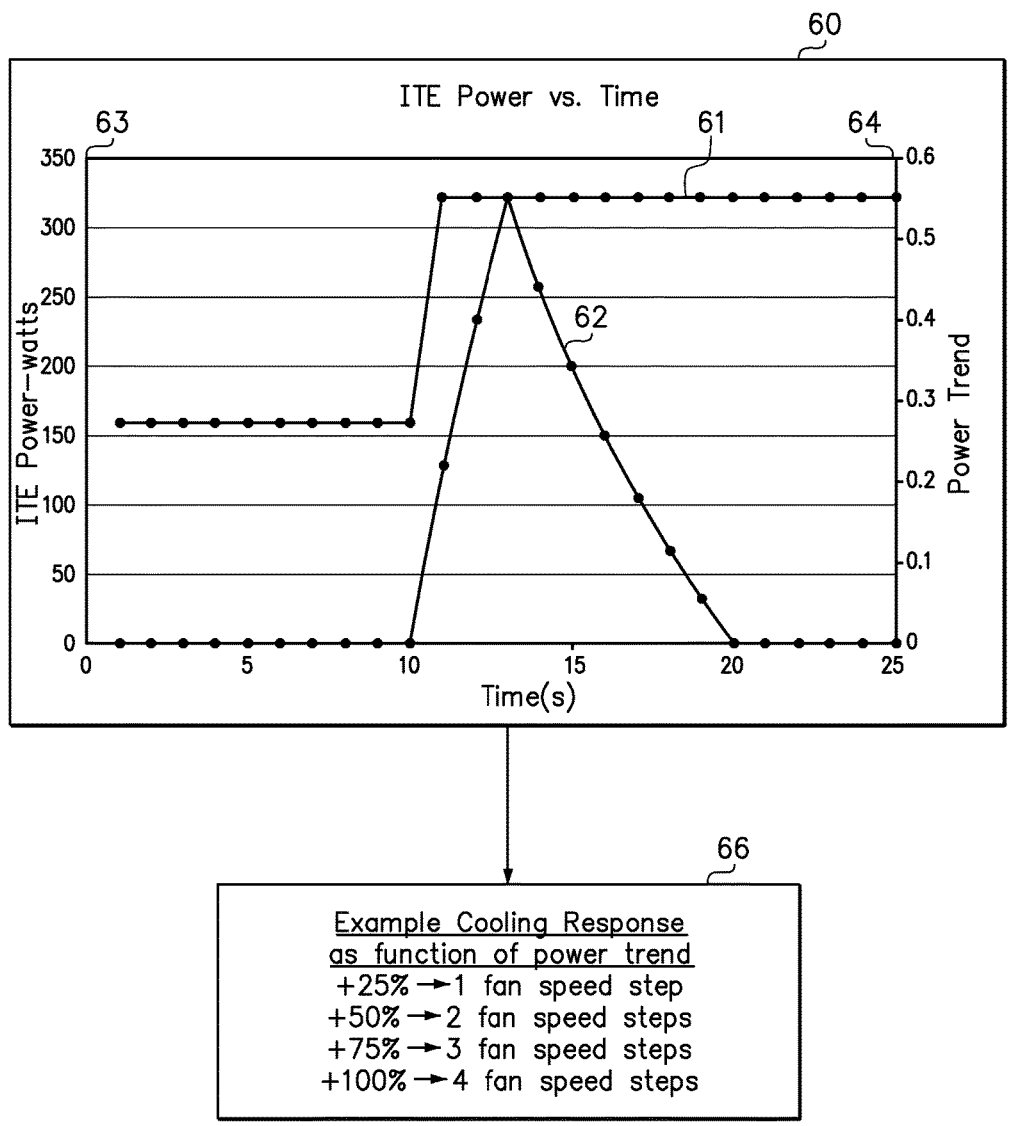
FIG. 3 is a graph plotting an instantaneous ITE power consumption and an ITE power consumption trend computed as a function of instantaneous ITE power consumption.

FIG. 3 is a graph 60 plotting an instantaneous ITE power consumption 61 and an ITE power consumption trend 62 computed as a function of the instantaneous ITE power consumption. The instantaneous ITE power consumption 61 and ITE power consumption trend 62 are plotted as a function of time T in seconds(s). At any time T, the magnitude of the instantaneous ITE power consumption 61 is indicated by the left-side vertical axis 63 and the value of the ITE power consumption trend 62 is indicated by the right-side vertical axis 64. The instantaneous ITE power consumption 61 increases from a quasi-steady state value of 158 Watts (W) to 321 W at time T=10 s. The ITE power consumption trend 62 relates to the rate of change of the instantaneous ITE power consumption 61, and may be an amplitude of the signal 41 output by the power-based cooling control circuit 30 to the flow controller 42 in FIG. 1.

In this embodiment, the value of the ITE power consumption trend 62 is computed as $PT=(P2-P1)/P1$, where P1 is the moving average power consumption over a target time interval and P2 is the moving average power consumption over a shorter time interval. Specifically, P1 is the moving average power consumption over a ten-second time interval and P2 is the moving average power consumption over a three-second time interval in this example. Thus, a positive value of the ITE power consumption trend 62 indicates that the average power consumption over the preceding three seconds is higher than the average power consumption over the preceding ten seconds. This is just one example of a power consumption trend equation; any of a variety of different power consumption trend equations may be used, wherein the power consumption trend is computed on the basis of a non-zero time interval. Since the power consumption trend occurs over a non-zero time interval, the power consumption trend provides a better indication of power consumption that may lead to imminent heating, as it is possible for the instantaneous power consumption to vary dramatically without leading to a significant temperature increase.

An example cooling response chart 66 is also included in FIG. 3. The cooling response chart 66 indicates an example of a predefined fan response to the ITE power consumption trend 61. The flow rate is controlled by a fan speed. The fan speed may be adjusted in discrete steps (i.e., predefined fan speed states that may be described by a fan speed table) each time the magnitude of the power consumption trend reaches one of a plurality of predefined power threshold values. In this example, the power consumption trend values are at 25%, 50%, 75%, and 100%. If the value of the power consumption trend PT reaches 25% (i.e. 0.25 on the right-side vertical axis 64) then the fan speed is incremented 1 step. If the value of the power consumption trend PT reaches 50%, then the fan speed is incremented to 2 steps relative to the current or last known operating state. If the value of the power consumption trend PT reaches 75%, then the fan speed is incremented to 3 steps. If the value of the power consumption trend PT reaches 100%, then the fan speed is incremented to 4 steps. Note that the example power consumption trend equation PT=(P2-P1)/P1 allows for PT values of greater than 100%. Also, it is possible for the power consumption to increase gradually enough for the value of the power consumption trend PT to stay below the lowest threshold (25% in this example). In that case, the temperature-based cooling control system will continue to control the cooling rate according to the predefined temperature thresholds.

In the example graph 60 of FIG. 3, the instantaneous power consumption 61 jumps upward from 158 W to 321 W at time T=10 s. At the instant when T=10 s, the average power consumption for the past ten seconds (P1) and the average power consumption for the past three seconds (P2) are both still 158 W, since the ITE has been operating at a quasi steady state value of about 158 W for at least the preceding ten seconds. Thus, the value of the ITE power consumption trend 62 at T=10 s is still zero, but the power consumption trend curve 62 increases sharply. At time T=11 s, the computed values of P1 (average power consumption over ten seconds) and P2 (average power consumption over three seconds) would be about 174 W and 212 W, respectively. This gives the ITE power consumption trend 62 a value of about 0.22=(212 W-174 W)/174 W, or 22%, which is still less than the minimum power consumption threshold of 25%. At time T=12 s, the ITE power consumption trend 62 has increased to a value of about 0.40, or 40%, and the fan speed will have been increased automatically as the ITE power consumption trend 62 increases above the 25% threshold between T=11 s and T=12 s. At time T=13 s, the ITE power consumption trend 62 has increased to about 0.55 (55%), which is a local-maximum value of the ITE power consumption trend 62. The fan speed will have been increased automatically to two fan speed steps as the ITE power consumption trend 62 increases above the 50% threshold between T=12 s and T=13 s.

After time T=13 s, the power consumption trend curve 62 begins a steep decline, reflecting a slowing of the rate at which the average power consumption is increasing over the moving ten-second time interval. By time T=20 s, the value of the power consumption trend curve is back to zero. Optionally, as the ITE power consumption trend 62 begins to decline at T=13 s and passes back through the thresholds in reverse order, the methods of the present invention may also be utilized to reduce fan speed intelligently.

By responding to the ITE power consumption trend 62 rather than to just any increase in the instantaneous ITE power consumption 61, the power-based cooling control circuit 30 (FIG. 1) more intelligently manages cooling. For example, by following the ITE power consumption trend 62, the associated cooling response may respond minimally, if at all, to very brief power increases (i.e. power spikes). Power spikes of even high power magnitudes may be so short as to not greatly affect heat generation in the ITE. According to the power consumption trend equation PT=(P2-P1)/P1, a brief power spike of even a large magnitude may not cause the value of PT to exceed 25%, thus eliciting no fan response in this example. This de-sensitivity to very short power fluctuations avoids the fan or liquid coolant pump from fluctuating rapidly or haphazardly in response to every brief change in power. This helps prevent unnecessarily straining the cooling equipment or unnecessarily consuming higher power in cooling the ITE.

Figure 4:
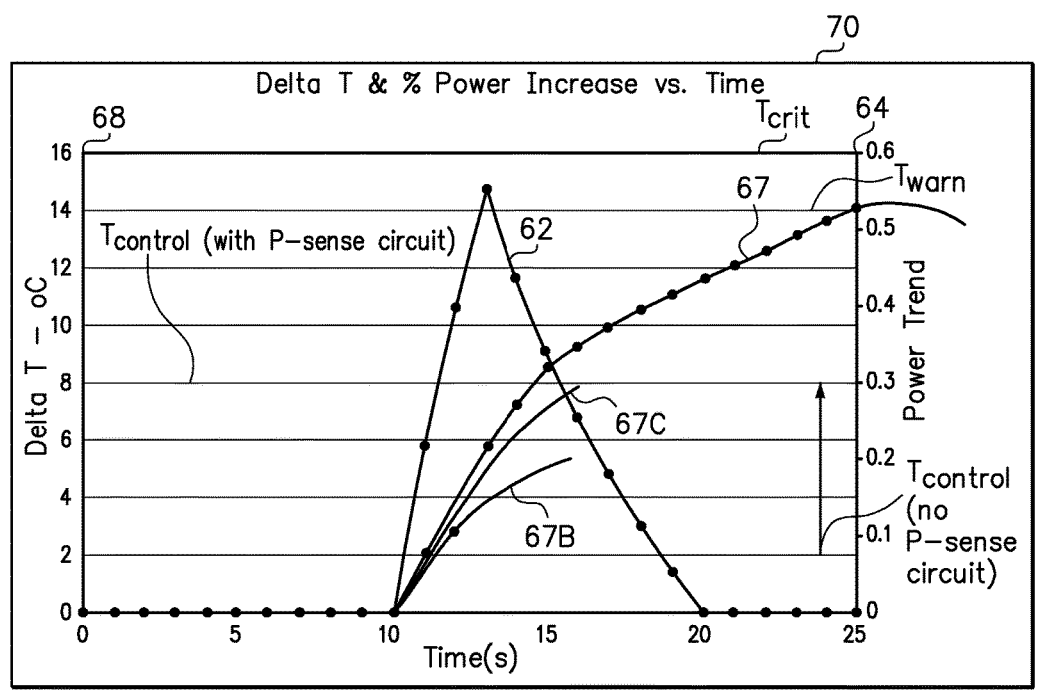
FIG. 4 is a graph provided as a visual aid in discussing how a temperature threshold may be raised when power consumption trend analysis is used to proactively increase fan speed.

FIG. 4 is a graph 70 provided as a visual aid in discussing how a temperature threshold may be desirably raised in a system that also includes the power-based cooling control circuit to proactively increase fan speed. A temperature response 67 and temperature axis 68 are provided on the same graph 70. The ITE power consumption trend 62 and PT axis 64 are carried over from FIG. 3 for reference. The temperature response 67 indicates an expected temperature increase ("delta T") in response to the increased power at time T=10 s, but in the absence of the proactive power-responsive cooling described with respect to FIG. 1. This expected temperature response in the absence of proactive cooling would lead to an expected 8.5 Celsius (C) rise in the first five seconds (i.e. from T=10 s to T=15 s), and a 12 C rise in twelve seconds. Using only a temperature-based cooling control such as provided by the temperature-based cooling control circuit 20 of FIG. 1, no fan speed increase would occur prior to a predefined temperature threshold, despite the increase in average power consumption reflected in the PT curve 62.

Some computer systems incorporate a temperature threshold (e.g. "Twarn" in the graph 70) that is lower than a critical temperature ("Tcrit"), for triggering a significant system response when approaching an unsafe temperature. For example, exceeding a temperature threshold Twarn may cause the system to automatically invoke a reduced power state, and exceeding an even higher threshold (e.g. "Tcrit" in the graph 70) may cause the system to automatically invoke an emergency action, such as to power down the system. Another temperature threshold (e.g. "Tcontrol" in the graph 70) that is even lower than Tcrit or Twarn may also be set, to initiate a cooling response well in advance of exceeding Twarn or Tcrit. In the example chart 70 of FIG. 70, Tcontrol is set 12 degrees below Twarn, which would require increasing the fan speed at about T=11 s under the consumption curve of FIG. 3. That would cause the temperature to "break" prematurely, as indicated at 67B in FIG. 4.

Providing a large margin between Twarn and Tcontrol can lead to higher-than-necessary fan speeds and associated fan power consumption at lower utilization states below Twarn or Tcrit. By combining the proactive power-based cooling control to temperature-based cooling control, the increase in temperature may be anticipated earlier by the system based on the power consumption trend 62, so that fan speed may be increased sooner and more gradually. This proactive cooling thereby avoids the need for such a large safety margin between Tcontrol and Twarn, allowing the temperature threshold Tcontrol to be increased to a value closer to Twarn. For example, as shown in FIG. 4, the usual 12-degree margin between Twarn and Tcontrol is reduced to about 6 degrees in this example when proactive power-based cooling is provided. The proactive power-based cooling results in a more gradual cooling that starts at lower temperatures, as indicated at 67C, so that the fan speed can be increased sooner and more gradually, avoiding peak fan speeds.

Figure 5:
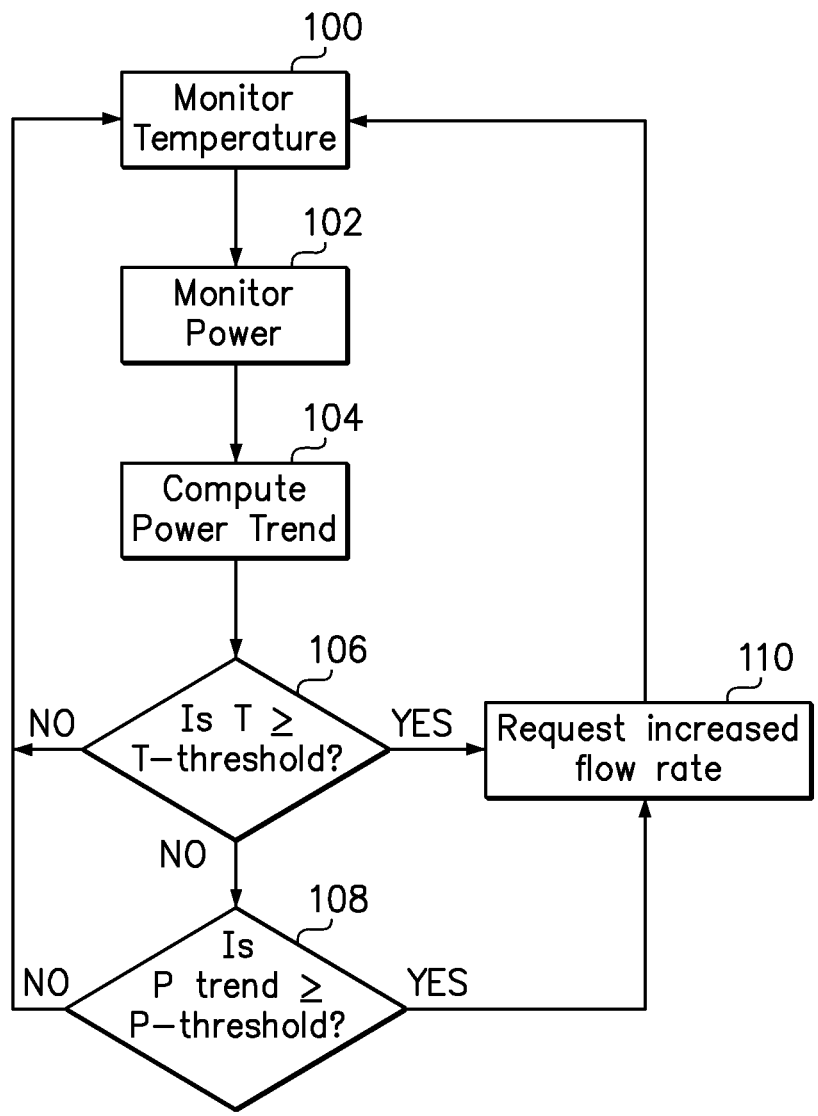
FIG. 5 is a flowchart of a method for controlling the cooling fluid flow rate in an electronic system on the basis of both temperature and power consumption trend analysis.

FIG. 5 is a flowchart generally outlining an example method for controlling the cooling fluid flow rate in an electronic system on the basis of both temperature and power consumption trend analysis. Details regarding specific steps of the flowchart may be aided by reference to the discussion of FIGS. 1-4, above. In step 100, temperature of one or more heat generating devices is monitored. In step 102, power of the one or more heat-generating devices is monitored. Steps 100 and 102 may be concurrently performed, such that dynamic temperature and power measurements are obtained. The temperature of the heat-generating devices is expected to be related to the power consumed by the heat-generating devices. A power consumption trend is computed in step 104, over a moving target time interval. Computing the power consumption trend includes identifying and quantifying the power consumption trend. A signal may be output in relation to the magnitude of the quantified power consumption trend.

In the outlined method, the temperature is used as a parameter in dynamically selecting a cooling rate. The power consumption trend computed in step 104 is also used as a parameter in dynamically selecting a cooling rate. The instantaneous power consumption monitored in step 102, however, is not directly used in selecting a cooling rate, since large spikes or other momentary fluctuations in the instantaneous power consumption would typically not warrant an immediate change in the cooling rate. In particular, the temperature is compared to a temperature threshold in conditional step 106. If the temperature has reached (i.e., is equal to or greater than) the temperature threshold, then an increased cooling fluid flow rate is requested in step 110. Otherwise, the temperature is below the temperature threshold, and conditional step 108 queries whether the magnitude of the power consumption trend has reached (i.e., is equal to or greater than) the power consumption trend threshold. If the power consumption trend has reached the power consumption trend threshold, then an increased cooling fluid flow rate is requested per step 110. The magnitude of the requested cooling increase in step 110 may be dependent on the temperature if the increase is due to the temperature exceeding the temperature threshold per step 106. The magnitude of the requested cooling increase in step 110 may instead be dependent on the computed power consumption trend if the increase is due to the power consumption trend exceeding the power consumption trend threshold per step 108.

As outlined in this flowchart, the value of the power consumption trend may cause an increase in the cooling fluid flow rate per conditional step 108, during a period that the temperature has not exceeded the temperature threshold per step 106. Thus, the power consumption trend is used proactively to initiate a cooling response before the temperature threshold is ever reached. This proactive, power-based control of the cooling system provides an earlier cooling system response than merely relying on temperature thresholds, since an increasing power consumption trend provides an early warning or prediction of an increasing temperature. Meanwhile, the computation of the power consumption trend helps to ensure that an early cooling system response is warranted, and helps prevent cooling system fluctuations from momentary power fluctuations in the instantaneous power consumption computed in step 102.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A fluid-cooled computer system, comprising:
    a plurality of heat-generating components;
    a cooling system configured for supplying a cooling fluid at a controlled cooling fluid flow rate to cool the heat-generating components;
    a temperature-based cooling control circuit including a temperature sensor configured for sensing a temperature of the heat-generating components and control logic for increasing a cooling fluid flow rate in response to the temperature exceeding a temperature threshold; and
    a power-based cooling control circuit including control logic for identifying and quantifying an increasing power consumption trend of the heat-generating components over a target time interval and, during a period that the temperature of the heat-generating components does not exceed the next higher temperature threshold, increasing a cooling fluid flow rate to the heat-generating components in response to the magnitude of the increasing power consumption trend exceeding a power threshold, wherein the increasing power consumption trend over the target time interval is quantified as a ratio of $(P2-P1)/P1$, wherein $P1$ is a measure of power consumption over the target time interval and $P2$ is a measure of power consumption over a shorter time interval.

2. The fluid-cooled computer system of claim 1, wherein the heat-generating components are included in a server.

3. The fluid-cooled computer system of claim 2, further comprising:
    a system management controller included on a motherboard of the server, the system management controller including the control logic for identifying and quantifying an increasing power consumption trend over a target time interval and the control logic for increasing a cooling fluid flow rate to the heat-generating components in response to the magnitude of the increasing power consumption trend exceeding a power threshold during a period that the temperature does not exceed the temperature threshold.

4. The fluid-cooled computer system of claim 1, further comprising:
    one or more cooling fans, wherein the control logic for increasing a cooling fluid flow rate comprises control logic for increasing a fan speed of the one or more cooling fans.

5. The fluid-cooled computer system of claim 1, further comprising:
    a liquid coolant heat exchanger in thermal communication with the one or more heat-generating components, wherein the control logic for increasing a cooling fluid flow rate comprises control logic for increasing a liquid coolant circulation rate through the heat exchanger.

6. The fluid-cooled computer system of claim 1, where $P1$ is a moving average power consumption over the target time interval and $P2$ is a moving average power consumption over the shorter time interval.

7. A method, comprising:
    monitoring a temperature of an electronic device;

increasing a cooling fluid flow rate to the electronic device in response to the temperature exceeding a temperature threshold;

monitoring a power consumption of the electronic device;

identifying an increasing power consumption trend over a target time interval for the electronic device;

quantifying the increasing power consumption trend over the target time interval as a ratio of $(P2-P1)/P1$, wherein P1 is a measure of power consumption over the target time interval and P2 is a measure of power consumption over a shorter time interval; and during a period that the temperature of the electronic device does not exceed the temperature threshold, increasing a cooling fluid flow rate to the electronic device in response to the magnitude of the increasing power consumption trend exceeding a power threshold.

8. The method of claim 7, further comprising:

dynamically varying the cooling fluid flow rate in relation to the magnitude of the power consumption trend for the electronic device.

9. The method of claim 7, where P1 is a moving average power consumption over the target time interval and P2 is a moving average power consumption over the shorter time interval.

10. The method of claim 7, wherein the shorter time interval is less than half of the target time interval.

11. The method of claim 7, wherein the target time interval has a fixed length of between 5 and 30 seconds.

12. The method of claim 7, further comprising:

maintaining a present cooling fluid flow rate where the power consumption trend includes power consumption spikes of less than a predefined duration.

13. The method of claim 7, further comprising:

overriding a current value of the cooling fluid flow rate that was previously selected in response to the magnitude of the increasing power consumption trend, and adjusting the cooling fluid flow rate to a predefined maximum value in response to the temperature exceeding the temperature threshold.

14. The method of claim 7, wherein the step of increasing the cooling fluid flow rate comprises one or both of increasing a fan speed and increasing a liquid coolant circulation rate.

15. A method, comprising:

monitoring a temperature of an electronic device;

increasing a cooling fluid flow rate to the electronic device in response to an increase in the temperature of the electronic device;

monitoring power consumption of the electronic device;

detecting an increasing power consumption trend for the electronic device;

quantifying the power consumption trend as the ratio of $(P2-P1)/P1$, where P1 is a measure of power consumption over a first time interval and P2 is a measure of power consumption over a second time interval that is shorter than the first time interval; and increasing a cooling fluid flow rate to the electronic device in response to the magnitude of the increasing power consumption trend exceeding a power threshold.

16. The method of claim 15, further comprising:

dynamically varying the cooling fluid flow rate in relation to the magnitude of the power consumption trend.

17. The method of claim 15, where P1 is a moving average power consumption over a first time interval and P2 is a moving average power consumption over a second time interval that is shorter than the first time interval.

18. The method of claim 15, wherein the cooling fluid flow rate is increased by one or both of increasing a fan speed and increasing a liquid coolant circulation rate.

\* \* \* \* \*